(12) United States Patent
Mistry et al.

(10) Patent No.: US 6,884,937 B1
(45) Date of Patent: Apr. 26, 2005

(54) ELECTROMAGNETIC COMPLIANT SHIELD HAVING ELECTROSTATIC DISCHARGE PROTECTION

(75) Inventors: Balwantrai Mistry, Nepean (CA); Mark Sonderegger, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/681,872

(22) Filed: Oct. 8, 2003

(51) Int. Cl.[7] .................................................. H05K 9/00
(52) U.S. Cl. ............................ 174/35 C; 174/35 GC; 361/816; 439/607
(58) Field of Search ........................ 439/607; 174/35 R, 174/35 C, 35 GC; 361/816, 818

(56) References Cited

U.S. PATENT DOCUMENTS

| | | | | |
|---|---|---|---|---|
| 5,045,971 A | * | 9/1991 | Ono et al. ................... 361/704 |
| 5,767,999 A | * | 6/1998 | Kayner ....................... 398/164 |
| 6,047,172 A | * | 4/2000 | Babineau et al. ........... 455/300 |
| 6,115,263 A | * | 9/2000 | Babineau et al. ........... 361/796 |
| 6,135,793 A | * | 10/2000 | Babineau ...................... 439/92 |
| 6,178,096 B1 | * | 1/2001 | Flickinger et al. .......... 361/816 |
| 6,206,730 B1 | * | 3/2001 | Avery et al. ................. 439/609 |
| 6,215,666 B1 | * | 4/2001 | Hileman et al. ............ 361/752 |
| 6,351,394 B1 | * | 2/2002 | Cunningham ............... 361/818 |
| 6,469,906 B1 | * | 10/2002 | Baltz et al. ................. 361/760 |
| 6,731,519 B1 | * | 5/2004 | Hwang ........................ 361/818 |

* cited by examiner

*Primary Examiner*—Hung V. Ngo
(74) *Attorney, Agent, or Firm*—Guerin & Rodriguez, LLP; William G. Guerin

(57) ABSTRACT

An electromagnetic compliant (EMC) shield for shielding electronic components on a circuit board from electromagnetic energy generated by electronics modules inside the EMC shield. The shield also contains electromagnetic energy generated by the electronic components on the circuit board from escaping to outside the EMC shield. The EMC shield includes a first side and a second side. The first side has a plurality of openings. Each of the openings is configured to receive a respective electronics module. The second side has a bottom edge with a groove to receive a conductive gasket. The first and second sides extend normal to the circuit board when the EMC shield is mounted to the circuit board.

17 Claims, 5 Drawing Sheets

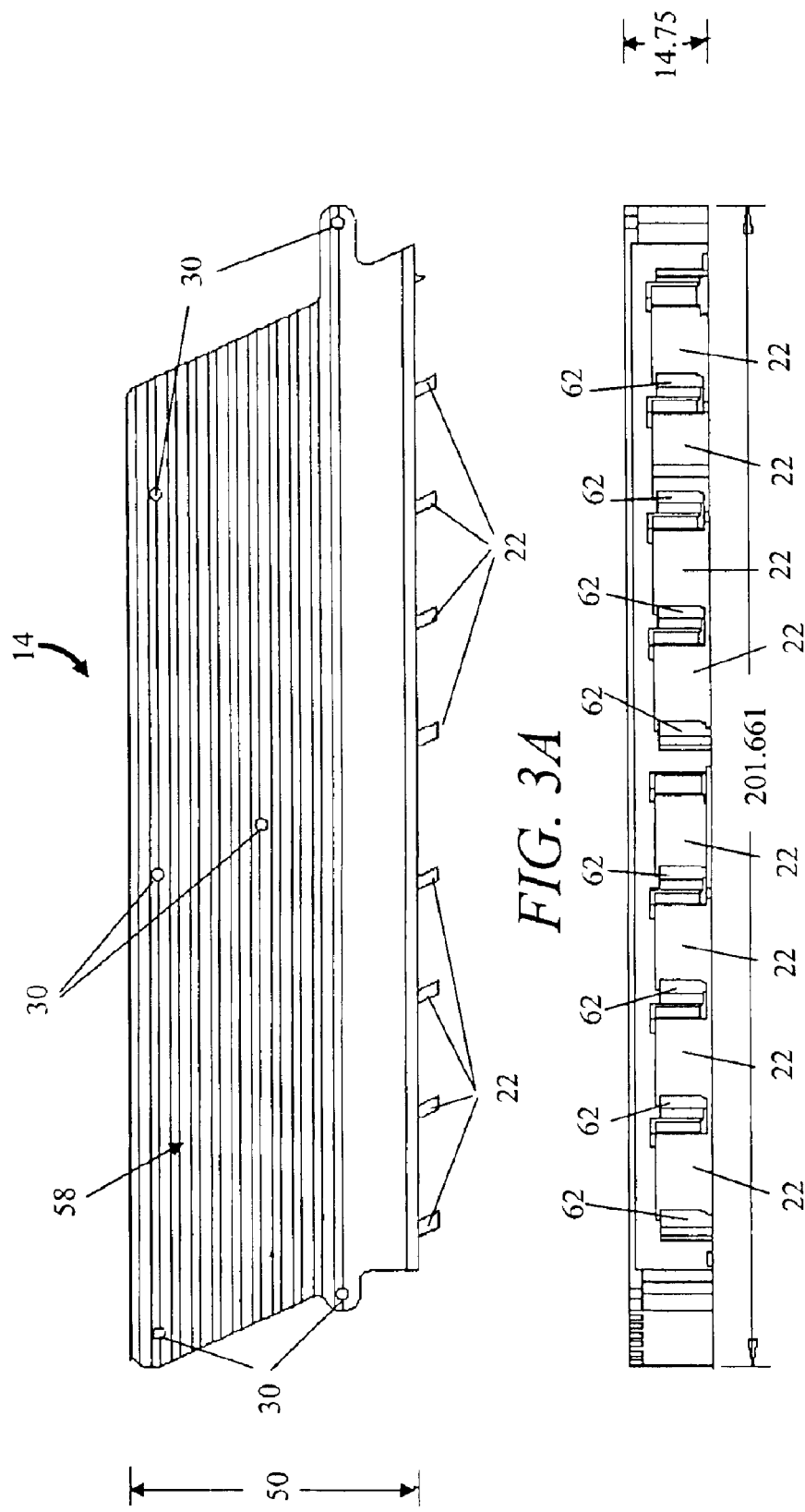

ELECTROMAGNETIC COMPLIANT SHIELD HAVING ELECTROSTATIC DISCHARGE PROTECTION

FIELD OF THE INVENTION

The invention relates generally to electromagnetic compliant enclosures and more specifically to electromagnetic compliant shields with heat sinking capability.

BACKGROUND

Data rates in communications systems continue to increase. As a result, there is a shift from purely electrical systems to optical systems and to combinations of optical and electrical systems. In combined systems, there are both electrical and optical components. These systems include components, such as laser transmitters and optical detector circuitry, to transform optical signals to electrical signals and/or electrical signals to optical signals. These components can generate electromagnetic interference (EMI), which interrupts the normal operation of other components and circuitry in the system. Electrostatic energy can also be created, which, if not discharged to ground path directly, can damage system components.

In many systems, the electrical and optical components are permanently attached to a printed circuit board (PCB). In such systems, if one of the electrical or optical components fails or an optical fiber pigtail from an optical component breaks, the PCB must be removed and replaced by an identical PCB. Certain electrical or optical components can be made removable and replaceable to avoid the need to replace the PCB upon component failure. Such components may be enclosed within an electromagnetic compliant (EMC) housing. The air within the enclosure is heated as a result of the operation of the optical components. The heat can cause the failure of components within the housing.

Accordingly, there exists a need for an EMI enclosure with electrostatic discharge (ESD) and heat sink functionality. The present invention satisfies this need and provides additional advantages.

SUMMARY OF THE INVENTION

In one aspect, the invention features an electromagnetic compliant (EMC) shield for shielding electronic components on a circuit board from electromagnetic energy generated by electronics modules inside the EMC shield and containing electromagnetic energy generated by the electronic components on the circuit board from escaping to outside the EMC shield. The EMC shield includes a first side having openings configured to receive one of the electronics modules and a second side having a bottom edge with a groove to receive a conductive gasket. The first and second sides extend normal to the circuit board when the EMC shield is mounted to the circuit board. In one embodiment, the EMC shield also includes electrostatic discharge (ESD) tabs. Each of the ESD tabs is disposed agjacent to a respective opening and is configured for electrical communication with a conductive element of a respective one of the electronics modules. In another embodiment, the second side has fins for removal of heat generated inside th EMC shield.

In another aspect, the invention features a circuit having an EMC shield for shielding electronic components in the circuit from electromagnetic energy generated by electronics modules inside the EMC shield. The circuit includes a circuit board with a mounted electronic component, a first side having openings and a second side. The openings are configured to receive one of the electronics modules. The second side is attached to the first side and has a bottom edge with a groove to receive a conductive gasket. The first and second sides extend normal to the circuit board. In one embodiment, the circuit also includes ESD tabs. Each ESD tab is disposed adjacent to an opening on the first side and is configured for electrical communication with a conductive element of one of the electronics modules.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 3A is a top view of the shield of FIG. 1;

FIG. 3B is an end view of the shield of FIG. 1; and

DETAILED DESCRIPTION

Figure 1:
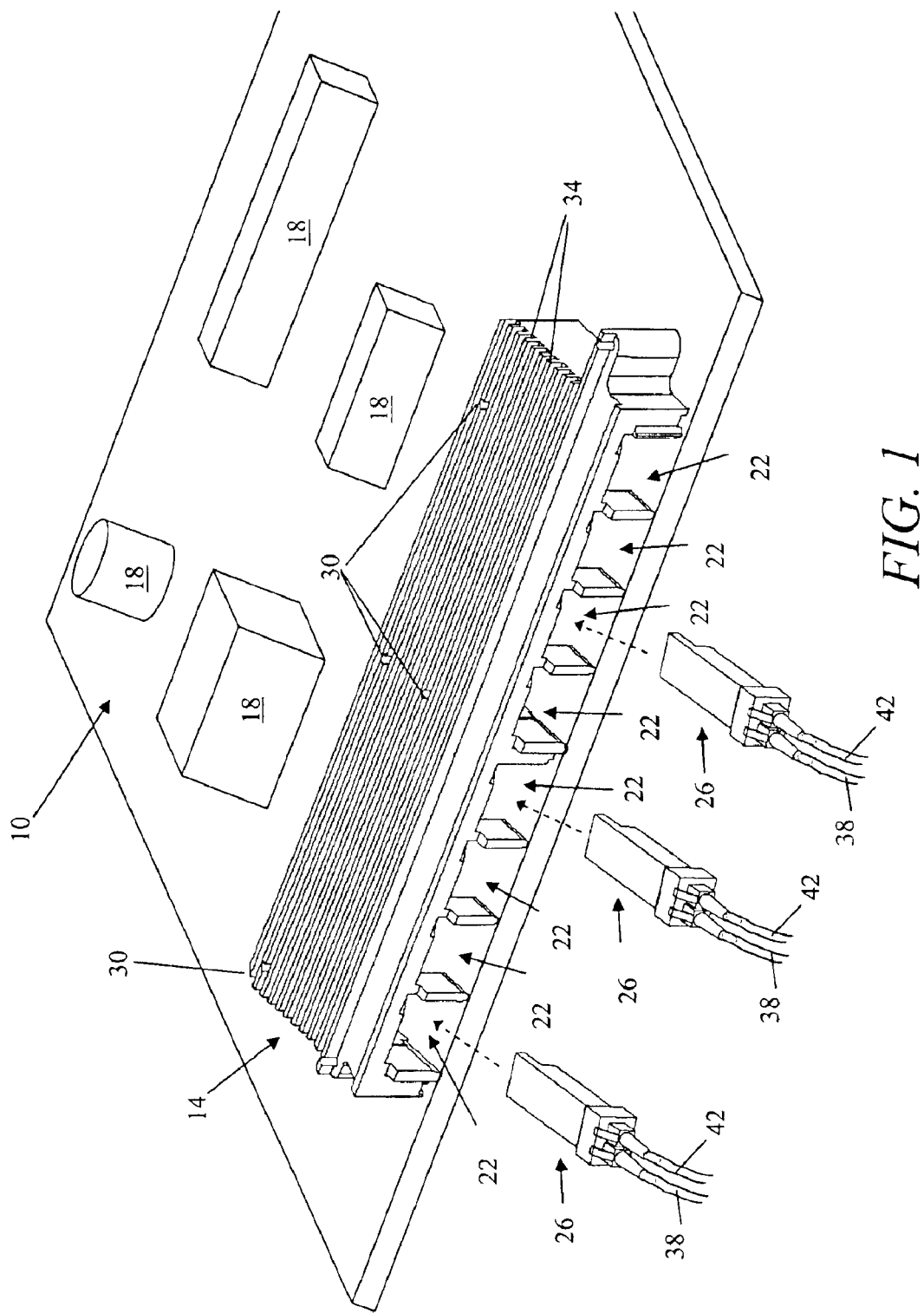
FIG. 1 is an isometric view of an electromagnetic compliant shield for use on a circuit board constructed according to the principles of the present invention.

With reference to FIG. 1, a printed circuit board (PCB) includes an electromagnetic compliant (EMC) shield, or housing, 14 (i.e., an enclosure) and a plurality of electrical components 18. The shield 14 includes a plurality of openings 22 each configured to receive an electronics module 26, a plurality of bores 30, and a plurality of fins 34 for heat dissipation. The number of fins 34 can vary according to the specific application of the PCB and the heat load generated by the enclosed electronics modules 26.

The shield 14 is mounted to the PCB 10 by fasteners extending through the bores 30. For example, the shield 14 is mounted to the PCB 10 by screws that engage threaded openings in the PCB 10.

The electronics modules 26 are inserted into respective openings 22 in the shield 14 and are in electrical communication with the various components 18 through traces on the PCB 10. In the illustrated embodiment, each electronics modules 26 is a small form factor pluggable optics modules (SFFP) having an internal laser transmitter and an optical receiver circuit. Each transmitter and receiver is in communication with a respective optical fiber 38 and 42, respectively, to transmit optical signals to or receive optical signals from other communications equipment. Together, the electronics modules 26 and the components 18 cooperate to form a part of a communications system.

Figure 2A:
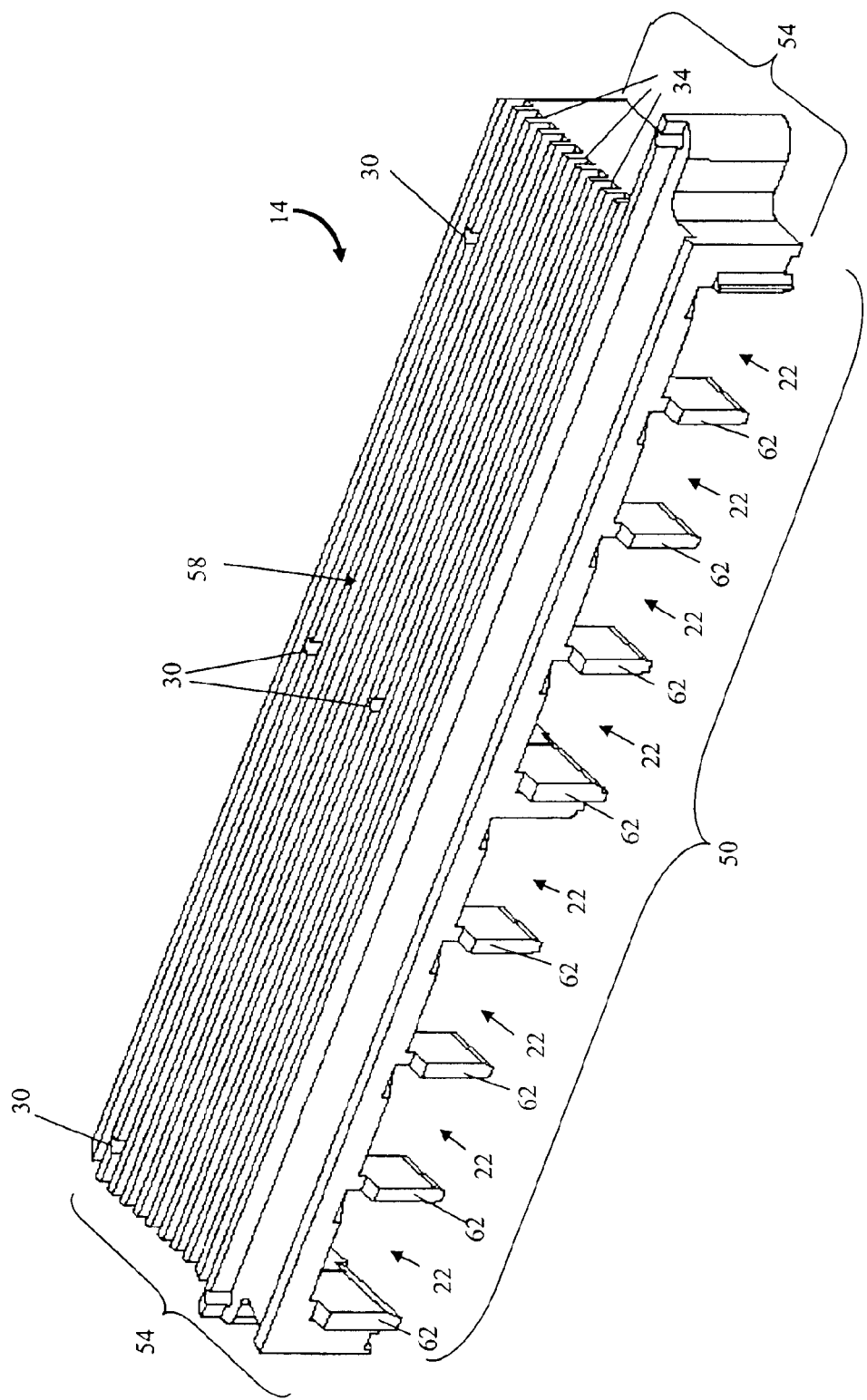
FIGS. 2A and 2B are isometric views of the shield of FIG. 1.
Figure 2B:
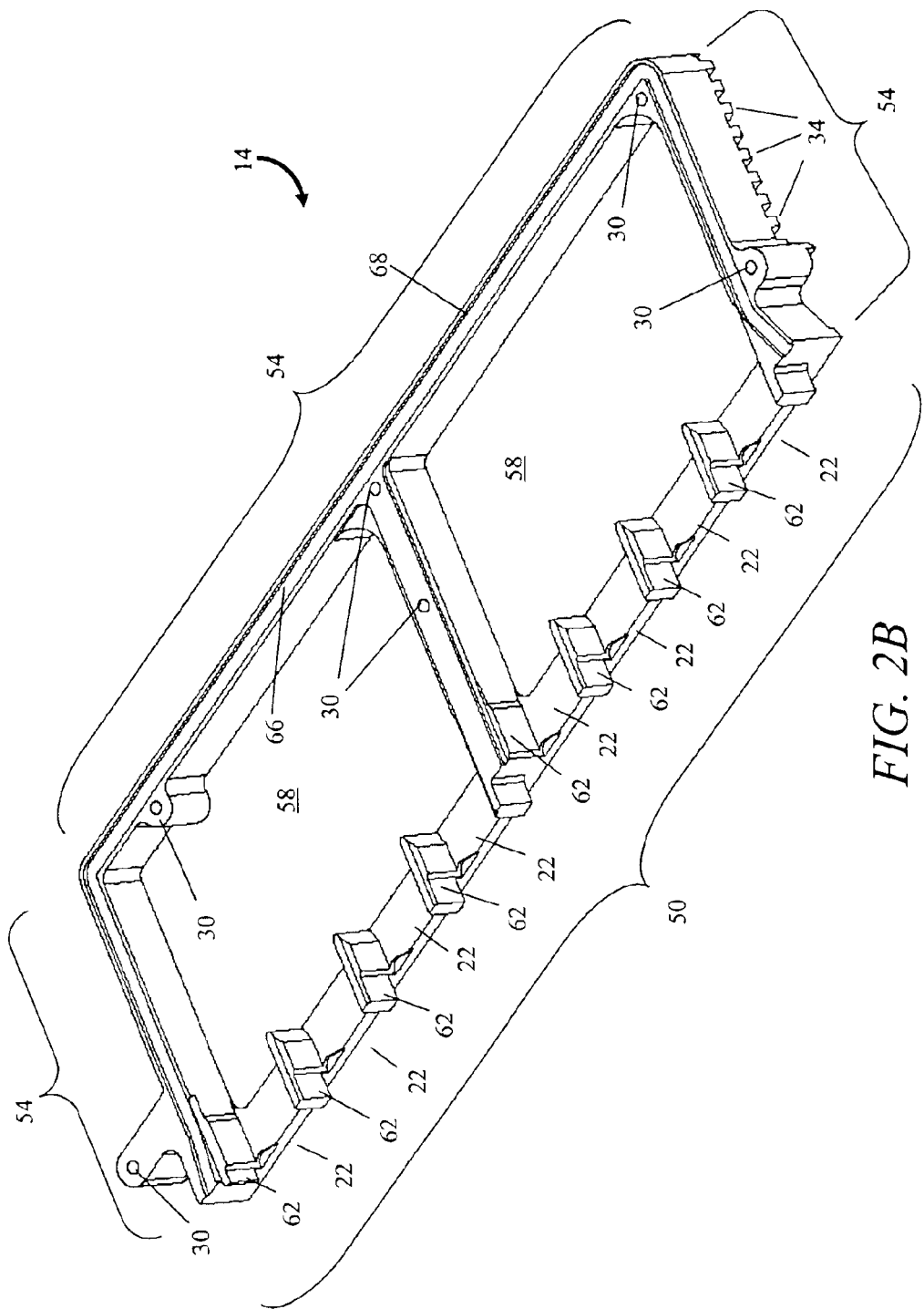

With reference to FIGS. 2A and 2B, in more detail the shield 14 includes a front side 50, three vertical sides 54, a top side 58, and a plurality of electrostatic discharge tabs 62. The front side 50 and the vertical sides 54 are normal to and extend from the PCB 10 when the shield 14 is mounted to the PCB 10.

The shield 14 is constructed as a single piece out of a thermally conductive-material such as Aluminum. Other materials, such as Zinc, Magnesium and copper can also be used. In other embodiments the shield 14 is a combination of different materials. For example, the sides 50, 54, 58 can be fabricated from different materials. The shield 14 is manufactured using a casting process, such as, Die cast. Alternatively, the shield 14 can be made using a machining from solid block of material.

Each vertical side 54 includes a bottom edge 68. A continuous groove 66 extends along the bottom edges 68 of all three vertical sides 54. The groove 66 is has a width and depth sufficient to receive a conductive gasket. The gasket eliminates any gap between the PCB 10 and the shield 14 that might otherwise let EMI generated within the shield 14 escape. The material used to fabricate this gasket is Chomerics choform 5513.

The top side 58 extends from the front side 50 to the vertical sides 54 and is parallel to the PCB 10. Thus the sides 50, 54, 58 define the shield 14, to enclose the electronics modules 26.

In the illustrated embodiment, the top side 58 provides the means to remove internally generated heat. In particular, the fins 34 extending along the surface of the top side 58 provide additional surface area for heat to be removed by convection. In other embodiments the fins 34 are fabricated on one or more of the vertical sides 54.

The height and length of the fins can vary according to the specific thermal management requirements. In addition, the number of fins on the surface can vary. The material used to construct the fins 34 can differ from the material for the shield 14. For example, the fins 34 can be made of copper, steel or any thermally conductive material and the shield 14 constructed of Aluminum.

It should be recognized that the shape of the shield 14 can vary significantly without departing from the principles of the invention. In one example, the three vertical sides 54 can be formed as a single, continuous side having any of a range of curvatures and/or bends. If the continuous side has a single radius of curvature, its combination with the top side 58 forms a half cylinder. In another example, the three vertical sides 54 and the top side 58 are formed as a single surface defining a quadrant of a spherical surface. In any of the above described embodiments, the fins 34 to dissipate internally generated heat can cover at least a portion of one or more of the sides.

The shield 14 includes electrostatic discharge tabs 62 disposed adjacent to the openings 22. Two adjacent tabs 62, a portion of the top side 58, and the PCB 10 define a bay, or local enclosure, for each of the electronics modules 26. When inserted into a bay (see FIG. 4), a conductive element of the electronics module 26 is brought into contact with one of the tabs 62 to provide grounding. The tabs 62 are made of an electrically conductive material such as copper.

FIGS. 3A and 3B illustrate another isometric top view and a front side view of the shield 14 of FIGS. 2A and 2B. Exemplary dimensions are shown in millimeters.

Figure 4:
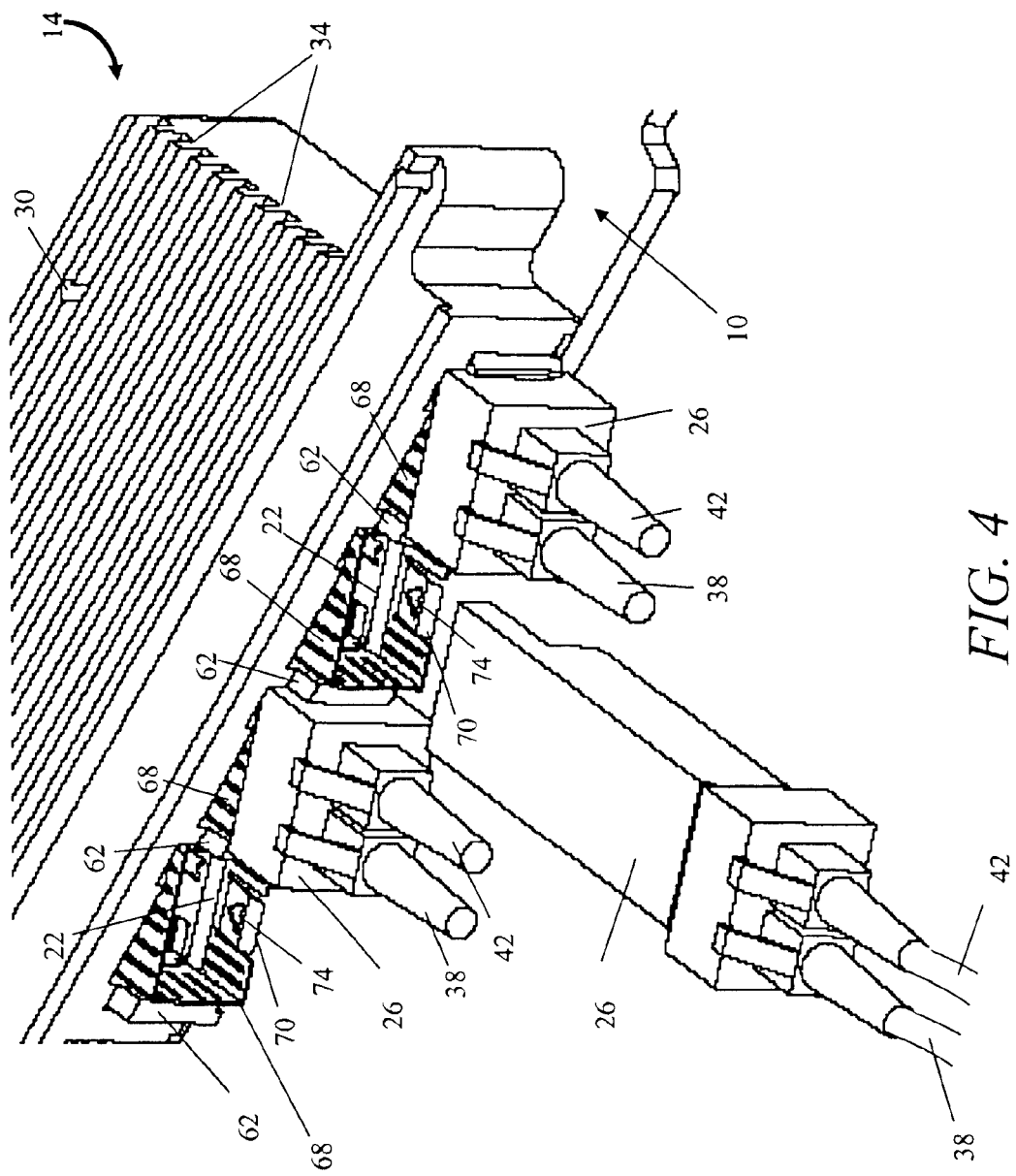
FIG. 4 is an isometric view of a portion of the shield of FIG. 1.

With reference to FIG. 4, in the illustrative embodiment a sleeve 68 is disposed within each opening 22 between the electronics module 26 and the ESD tabs 62. The sleeve 68 includes a release tab 70 having a recess 74 shaped to receive a similarly shaped protrusion (not shown) on the electronics module 26. The protrusion on the electronics module 26 engages the recess 74 to lock, or secure, the electronics module 26 in proper registration in the opening 22.

While the invention has been shown and described with reference to specific preferred embodiments, it should be understood by those skilled in the art that various changes in form and detail may be made therein without departing from the spirit and scope of the invention as defined by the following claims.

What is claimed is:

1. An electromagnetic compliant (EMC) shield for shielding electronic components on a circuit board from electromagnetic energy generated by electronics modules inside the EMC shield and containing electromagnetic energy generated by the electronic components on the circuit board from escaping to outside the EMC shield, the EMC shield comprising:
   a first side having a plurality of openings, each of the openings configured to receive one of the electronics modules;
   a second side having a bottom edge with a groove therein to receive a conductive gasket, the first and second sides extending substantially normal to the circuit board when the EMC shield is mounted to the circuit board; and
   a plurality of electrostatic discharge (ESD) tabs, each of the ESD tabs disposed adjacent to a respective opening and configured for electrical communication with a conductive element of a respective one of the electronics modules.

2. The EMC shield of claim 1 further comprising a third side disposed between the first and second sides, wherein the third side has a plurality of fins for removal of heat generated inside the EMC shield.

3. The EMC shield of claim 1 wherein the second side has a plurality of fins for removal of heat generated inside the EMC shield.

4. The EMC shield of claim 1 further comprising a conductive gasket partially disposed in the groove in the bottom edge of the second side.

5. The EMC shield of claim 1 further comprising one of the electronics modules coupled to the EMC shield at one of the openings in the first side and extending inside the EMC shield.

6. The EMC shield of claim 5 wherein the one of the electronics modules comprises an optics module.

7. The EMC shield of claim 6 wherein the optics module comprises a laser transmitter and a laser receiver.

8. The EMC shield of claim 1 wherein at least one of the first and second sides has an opening adapted to receive a fastener for attachment of the EMC shield to the circuit board.

9. The EMC shield of claim 1 wherein the first and second sides are fabricated from a thermally conductive material.

10. An electromagnetic compliant (EMC) circuit module comprising:
    a circuit board having an electronic component mounted thereon; and
    an EMC shield having:
       a conductive gasket in contact with the circuit board;
       a first side having a plurality of openings, each of the openings configured to receive one of the electronics modules, the first side extending substantially normal to the circuit board;
       a second side attached to the first side and having a bottom edge with a groove therein to receive the conductive gasket, the second side extending substantially normal to the circuit board; and
       a plurality of electrostatic discharge (ESD) tabs, each of the ESD tabs disposed adjacent to a respective opening on the first and configured for electrical communication with a conductive element of a respective one of the electronics modules.

11. The circuit of claim 10 further comprising a third side disposed between the first and second sides, wherein the third side has a plurality of fins for removal of heat generated inside the EMC shield.

12. The circuit of claim 10 wherein the second side has a plurality of fins for removal of heat generated inside the EMC shield.

13. The circuit of claim 10 further comprising a conductive gasket partially disposed in the groove in the bottom edge of the second side.

14. The circuit of claim 10 further comprising one of the electronics modules coupled to the EMC shield at one of the openings in the first side and extending inside the EMC shield.

15. The circuit of claim 10 wherein at least one of the first and second sides has an opening adapted to receive a fastener for attachment of the EMC shield to the circuit board.

16. The circuit of claim 10 wherein the first and second sides are fabricated from a thermally conductive material.

17. The circuit of claim 10 wherein the circuit board is a printed circuit board.

* * * * *